(12) United States Patent
Ngo et al.

(10) Patent No.: US 6,963,250 B2
(45) Date of Patent: Nov. 8, 2005

(54) VOLTAGE CONTROLLED OSCILLATOR WITH SELECTABLE FREQUENCY RANGES

(75) Inventors: Hung C. Ngo, Austin, TX (US); Gary D. Carpenter, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 10/718,062

(22) Filed: Nov. 20, 2003

(65) Prior Publication Data

US 2005/0110578 A1 May 26, 2005

(51) Int. Cl.[7] .............................................. H03B 27/00
(52) U.S. Cl. .................... 331/57; 331/177 R; 331/179; 327/291
(58) Field of Search .............................. 331/16, 45, 57, 331/74, 175, 177 R, 179; 327/101, 105, 113, 327/114, 158, 159, 291–297, 299

(56) References Cited

U.S. PATENT DOCUMENTS

| 4,517,532 | A | * | 5/1985 | Neidorff ...................... 331/57 |
| 5,418,499 | A | * | 5/1995 | Nakao .......................... 331/57 |
| 5,434,525 | A | * | 7/1995 | Leonowich .................. 327/278 |
| 5,448,205 | A | * | 9/1995 | Rothermel ................... 331/57 |
| 5,861,780 | A | * | 1/1999 | Fukuda ........................ 331/57 |
| 6,081,165 | A | * | 6/2000 | Goldman ..................... 331/57 |
| 6,310,928 | B1 | * | 10/2001 | Yunome ..................... 375/376 |
| 6,515,550 | B2 | * | 2/2003 | Demsky et al. ............... 331/57 |
| 6,559,727 | B2 | * | 5/2003 | Boerstler ..................... 331/57 |
| 6,650,190 | B2 | * | 11/2003 | Jordan et al. ................. 331/57 |
| 6,710,668 | B1 | * | 3/2004 | Carpenter et al. ............ 331/57 |
| 6,809,602 | B2 | * | 10/2004 | Boerstler et al. ............. 331/57 |
| 6,831,524 | B1 | * | 12/2004 | Krawczyk et al. ............ 331/57 |

OTHER PUBLICATIONS

"Glitchless Wide-Range Oscillator, and Method Therefor," U.S. Appl. No. 10/242,256, filed Sep. 12, 2002, Pending, 26 pages.

* cited by examiner

Primary Examiner—Timothy P. Callahan
Assistant Examiner—Hai L. Nguyen
(74) Attorney, Agent, or Firm—Richard F. Frankeny; Winstead Sechrest & Minick P.C.; Casimer K. Salys

(57) ABSTRACT

A VCO is configured using a ring oscillator with voltage controlled feedforward inverting stages coupled around the inverting stages making up the basic ring oscillator to enable the frequency of the ring oscillator to be voltage controlled. A latch and multiplexer is used to select between two or more outputs within the ring oscillator to change the basic frequency range of the VCO glitch free. To achieve a wide range VCO, additional stages are added to the basic ring oscillator. When the number of stages is an odd number greater than seven, then the voltage controlled feedforward inverting stages feedback to the outputs of the first and second inverting stages of the ring oscillator. Two additional multiplexers are added to select which feedforward inverting stage is coupled to the first and second inverting stage. This allows a wide range interleaved VCO that switches between frequency ranges glitch free.

15 Claims, 9 Drawing Sheets

VOLTAGE CONTROLLED OSCILLATOR WITH SELECTABLE FREQUENCY RANGES

TECHNICAL FIELD

The present invention relates in general to voltage controlled oscillators (VCOs) and in particular to VCOs formed using a ring oscillator configuration.

BACKGROUND INFORMATION

Phase-locked loops (PLLs) have been widely used in high-speed communication systems because PLLs efficiently perform clock recovery or clock generation at a relatively low cost. Dynamic voltage and frequency scaling is a critical capability in reducing power consumption of power sensitive devices. Scaling, in this sense, means the ability to select high performance with nominal power supply voltages and high frequency clock operation or low performance by reducing the power supply voltage and corresponding the clock frequency. Reducing the system power is usually done when performance is not needed or when running from a limited energy source such as a battery. To allow low power operation, the PLL and other circuits must support very aggressive power/energy management techniques. For the PLL, this means low power operation while supporting key required features such as dynamic frequency scaling, dynamic voltage scaling, clock freezing and alternate low frequency clocking. Dynamic implies that the PLL is able to support changes in the output frequency and logic supply voltage without requiring the system to stop operation or waiting for the PLL clock to reacquire lock.

Using a PLL or delay-locked loop (DLL) has advantages in a battery powered system because a PLL is able to receive a lower reference frequency from a stable oscillator to generate system clock frequencies. A PLL also allows changing the system clock frequency without changing the reference frequency. The prior art has described ways of selecting operating points of voltage and frequency statically, for example, stopping execution while allowing the PLL to frequency lock to a new frequency. This slows system operations and complicates system design.

One of the key circuits in a PLL is a voltage-controlled oscillator (VCO). Circuits in the PLL generate an error voltage that is coupled to the VCO to control the frequency of the VCO output. By frequency dividing the output of the PLL and feeding it back and comparing it to a low frequency crystal-controlled reference clock, a stable high frequency clock may be generated. The VCO in a PLL typically has a range over which the frequency of the VCO may be voltage-controlled. In systems employing frequency scaling, it is desirable to have a voltage-controlled frequency range for normal voltage operation and another voltage-controlled frequency range for low voltage operation without resorting to two VCOs.

VCO circuits employ ring oscillators comprising an odd number M of inverters in a string or sequence from the basic oscillator block. A transition on the input of the ring oscillator emerges at the output after a delay equal to the sum of the delay through the inverters. This is equal to one half the period of the basic oscillator frequency. By coupling a voltage controlled inverting circuit around inverting stages, the basic oscillator frequency may be modified. This allows a common control voltage to vary the basic frequency thus forming a VCO circuit. If larger changes in frequency are desired, then the odd number M of inverters may be varied by selecting which inverter is the output to feedback to the input. This results in a VCO circuit that has a wider range than is possible with a fixed number of M inverters in a ring oscillator. If the VCO basic frequency is to be modified dynamically, then selecting which of the M inverters is the output, requires circuitry to assure that the switching is done without producing glitches which would cause problems when the VCO is used to produce a computer clock. Providing a VCO that has a selectable frequency range and dynamic frequency switching would be useful in producing with a computer clock a wide variation in system performances.

There is, therefore, a need for a wide range VCO circuit that allows dynamic frequency range changing that is glitch free.

SUMMARY OF THE INVENTION

A voltage controlled oscillator (VCO) circuit comprises a configurable ring oscillator circuit with a maximum number of M fixed delay (FD) inverting stages forming M+1 sequential nodes. The M FD inverting stages are partitioned into M groups of FD inverting stages. Each of the M groups of FD inverting stages has an inverting voltage controlled feedforward circuit element (FFE) directly coupled in parallel and a number 2K FFEs that are selectively coupled to feedforward nodes or feedback nodes where K corresponds to the number of selectable frequency ranges. The frequency range of the VCO circuit is modified by electronically selecting one signal from K first candidate nodes to couple back to the input of the first inverting stage. Likewise, the outputs of K second candidate FFEs are selectively coupled to either a feedforward node or back to node two. Additionally, the outputs of K third candidate FFEs are selectively coupled to either a feedforward node or back to node three. Node one is coupled to the output of a first multiplexer (MUX) for selecting signals from the K first candidate nodes to couple back to node one as a feedback signal in response to one or more latched select signals. Node two is coupled to the output of a second MUX for selecting signals on the K second candidate outputs for coupling the correct FFE back to node two. Node three is coupled to a output of a third MUX for selecting signals on the K third candidate outputs for coupling the correct FFE back to node three. The first, second and third MUXs are controlled by the one or more latched select signals.

One or more asynchronous select signals are latched to form the one or more latched select signals in response to a signal on one of the K first candidate nodes thereby assuring frequency range switching occurs glitch free. Since selected feedforward paths may be coupled to a forward inverting stage or back to a preceding stage, an electronic switch is employed to isolate a feedforward path if it is selected as the feedback path. The electronic switches are controlled by the one or more latched select signals.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
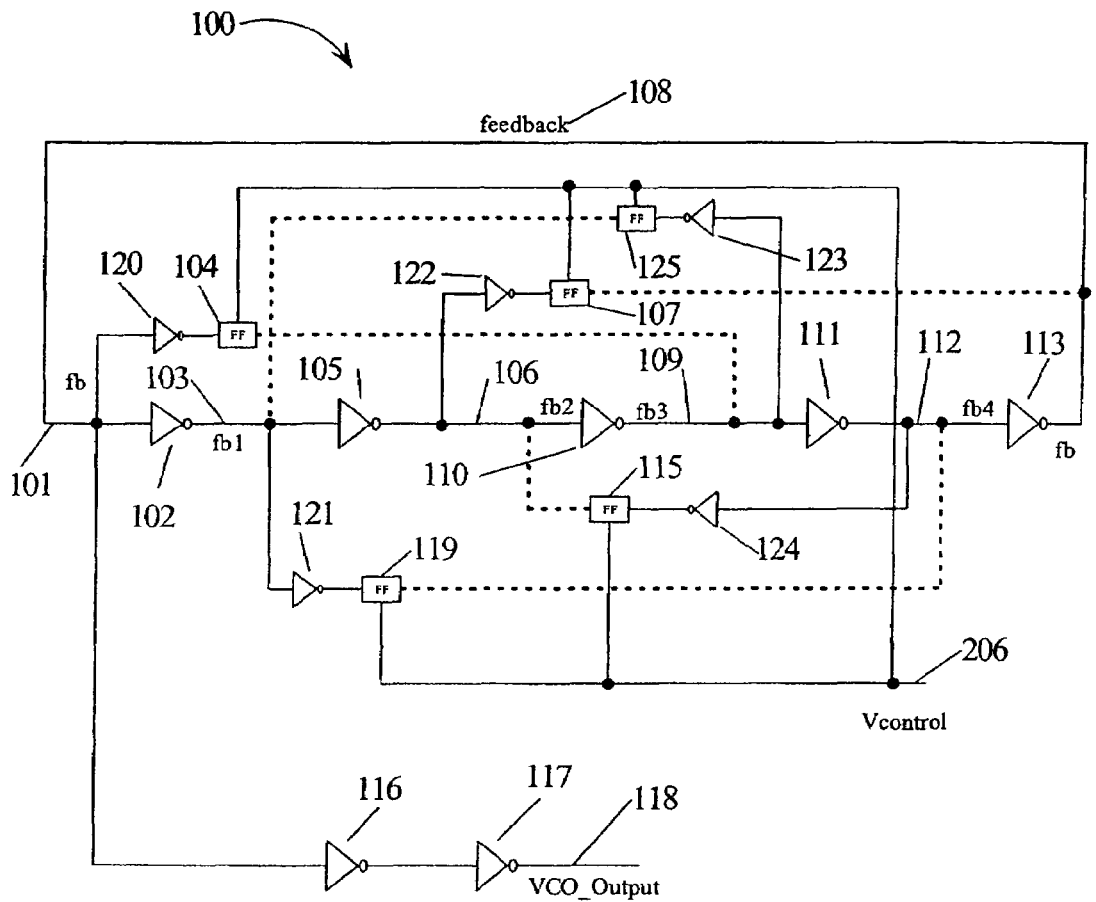
FIG. 1 is a block diagram of a voltage-controlled oscillator (VCO) using a feedforward element which is varied with a control voltage.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 2:
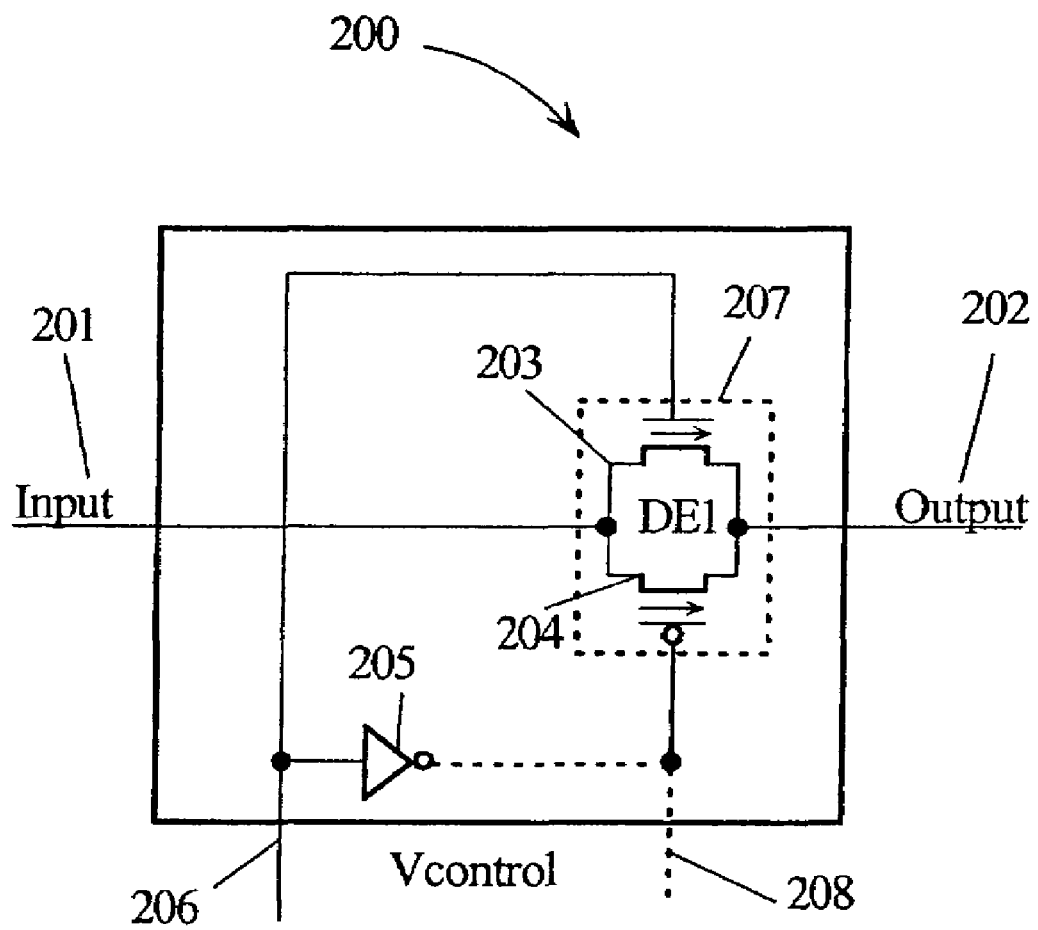
FIG. 2 is a circuit diagram of a feedforward element comprising a transfer gate.

FIG. 2 is a circuit diagram of voltage controlled feedforward (FF) circuit element 200 used in embodiments of the present invention. Transfer gate 207 is controlled by opposing control voltages Vc 206 and Vcb 208 generated by inverting circuit 205. Although transfer gates are normally used for bi-directional switches, varying the gate voltages of the parallel devices varies their conductance. Transfer gate 207 shows an exemplary circuit comprising parallel N channel field effect transistor (NFET) 203 and P channel FET (PFET) 204.

FIG. 1 is a circuit diagram of a voltage-controlled oscillator (VCO) 100 using a feedforward configuration and employing voltage controlled FF circuit elements (e.g., FF circuit element 200). Inverters 102, 105, 110, 111, and 113 are connected in series, output to input, generating a ring of five inverters where the output of the fifth inverter is connected back to the input of the first inverter. Inverters 102, 105, 110, 111, and 113 form the primary path of VCO 100. FF circuit elements 104, 119, 107, 125, and 115 (e.g., FF circuit element 200) are coupled between nodes of the primary path using inverters 120–124, respectively. If FF circuit elements 104, 107, 115, 119, and 125 are not conducting (controlled by Vcontrol 206), then VCO 100 operates at its lowest frequency. If the FF circuit elements 104, 119, 107, 125, and 115 are active, they will conduct a current signal to a corresponding following inverter in proportion to the magnitude of the control voltage Vcontrol 206. Feedback 108 is the connection of the output of inverter 113 back to the input of inverter 102 forming node fb 101. Inverters 116 and 117 perform the function of reshaping the signal fb 101 as the VCO output 118.

This connection of the inverters and transfer gates results in a normal propagation path and a parallel feedforward path. For example, the feedforward path including feedforward element 104 is in parallel with the series connection of inverters 103, 105 and 110 (from fb 101 to fb3 109). A signal transition on fb 101 will result in a corresponding opposite transition on node fb3 208 at a delay time determined by the delay of primary path inverters 103, 105 and 110. At the time of a transition on fb 101, fb3 109 will be static awaiting the transition through inverters 103, 105 and 110. If FF circuit element 104 is in an ON state, as determined by the level of Vc 206, then the path through inverter 120 and FF circuit element 104 will result in the transition occurring earlier. This speeds up the primary path and causes VCO 100 to have a higher frequency. All the feedforward paths comprising inverter 120 and FF circuit element 104, inverter 121 and FF circuit element 119, inverter 122 and FF circuit element 107, inverter 124 and FF circuit element 115, and inverter 123 and FF circuit element 125 operate in the same fashion. As control voltages Vc 206 is varied, the FF circuit elements 104, 119, 107, 115 and 125 may be operated from a point of cutoff where no conduction occurs to one of saturation where conduction is no longer affected by control voltages Vc 206. Inverter 116 and 117 are used to shape the signal at node fb 101 to VCO output 118.

Figure 3:
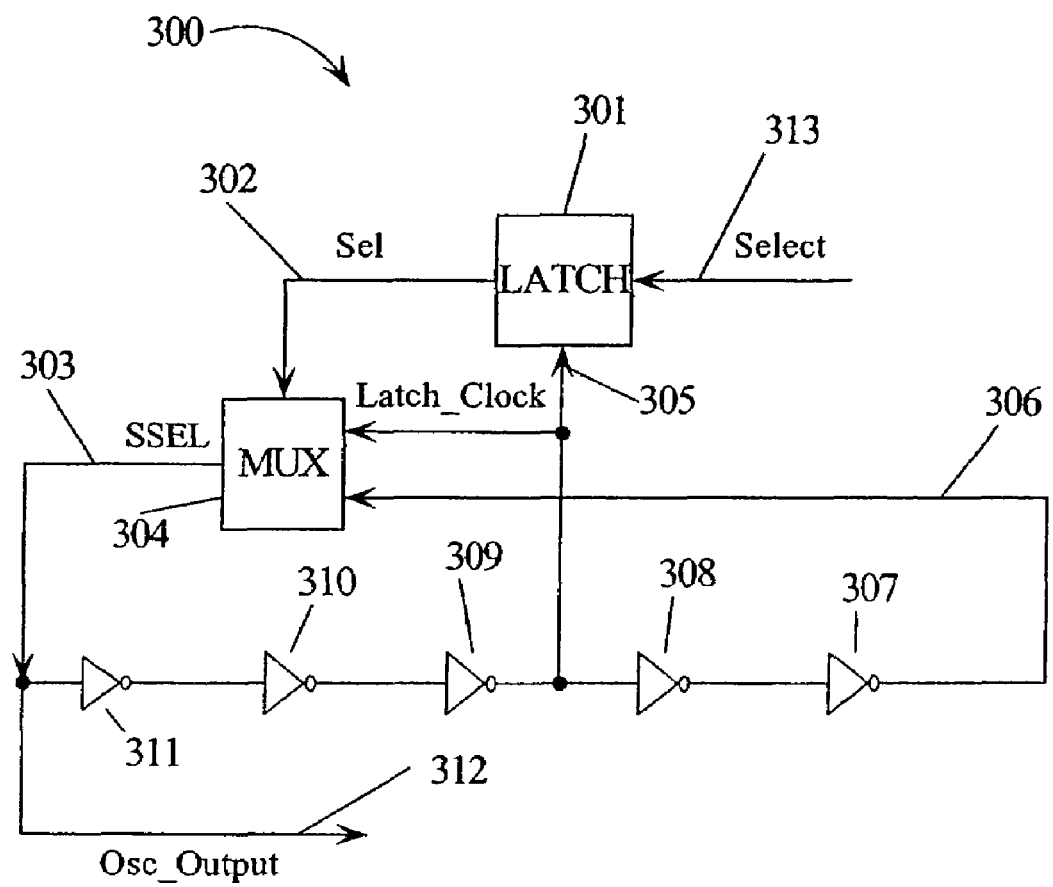
FIG. 3 is a circuit for selecting between the outputs of inverting stages in a ring oscillator to couple back to the input to switch frequencies of the ring oscillator glitch free.

FIG. 3 is a diagram of multiplexing circuitry used to switch frequency ranges in a ring oscillator comprising an odd number of inverting stages. Inverters 307–311 are used to set the basic frequency of oscillator circuit 300. Multiplexer (MUX) 304 selects between output 305 and 306 in response to the logic state of Sel 302 generating Ssel 303 which is also Osc_Output 312. Latch 301 receives a command on Select 313 to select the feedback path from outputs 305 and 306. When output 305 is selected, oscillator circuit 300 operates at its highest frequency. When output 306 is selected oscillator circuit 300 operates at its lowest frequency. To insure glitch free selection between outputs 305 and 306 requires the switching to be synchronized with logic states on outputs 305 and 306. Latch 301 is an edge triggered master/slave latch that stores the state of Select 313 on a positive transition on the Latch_clock (output 305). Latch 301 then asserts the stored state of Select 313 at Sel 302 on a negative transition of Latch_clock 305. By designing Latch 301 to have a proper delay, the changing of the feedback path determined by Select 313 occurs while both outputs 305 and 306 are at a logic zero insuring a glitch free range change for oscillator circuit 300 in response to a change in the logic state of Select 313.

Figure 4:
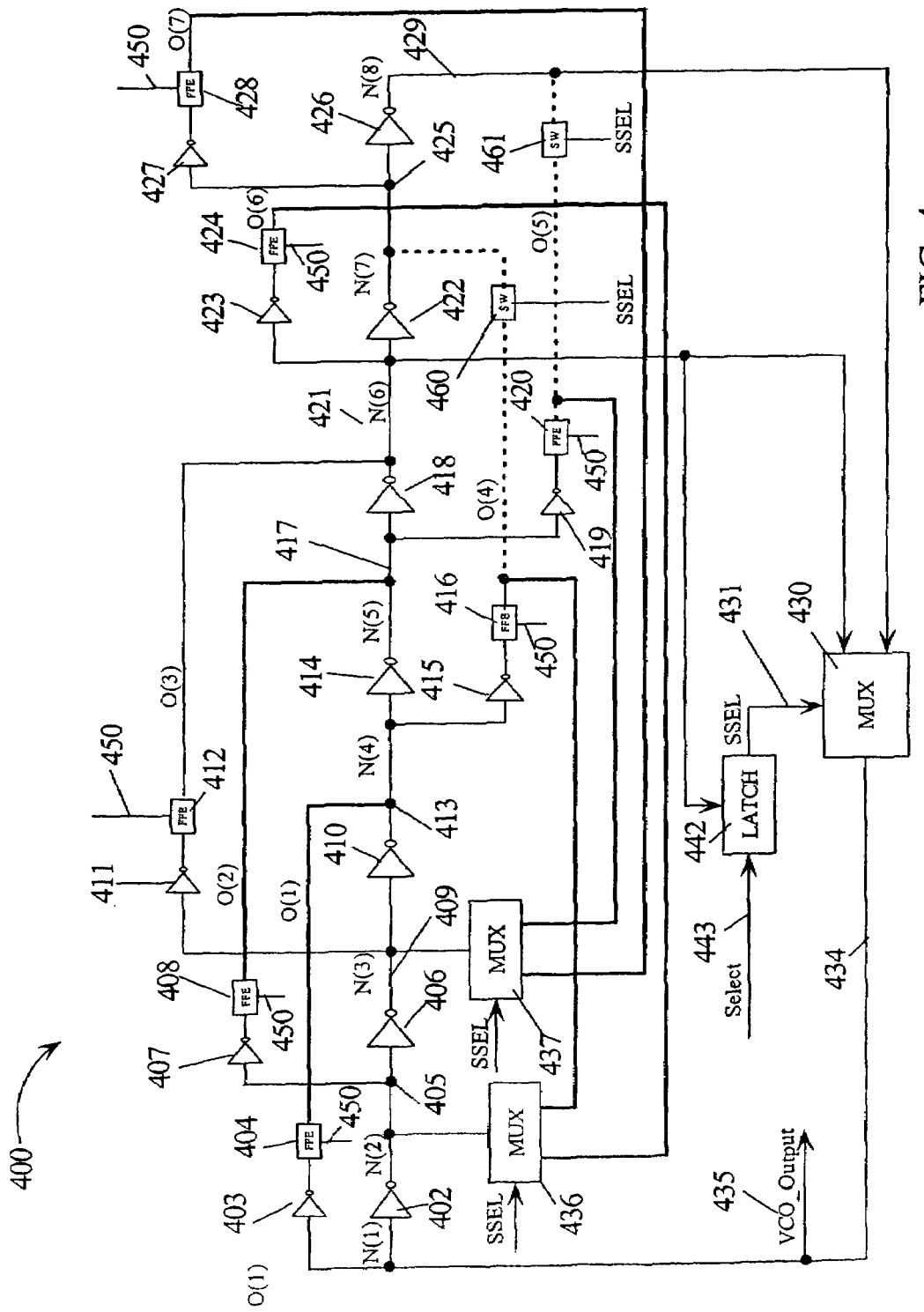
FIG. 4 is a circuit diagram of a wide range interleaved VCO according to embodiments of the present invention.

FIG. 4 is a circuit diagram of a wide band interleaved VCO 400 according to embodiments of the present invention. The basic frequency of VCO 400 is determined by the delay loop formed by inverters 402, 406, 410, 414, 418, 422, and 426. There are seven feedforward paths comprising an inverter (e.g., inverter 403) and an feedforward circuit element (FFE) (e.g., 404). The string of seven inverting stages are partitioned into seven groups of inverting stages each comprising three inverters (e.g., the inverting stage comprising inverters 402, 405, and 410). Each of these groups of inverting stages has a feedforward path comprising an inverter (e.g., 403) and an FFE (e.g., 404). Each of the FFEs has a control voltage (not shown) in this diagram. (See, FIG. 2). The frequency range of VCO 400 may be changed by which of the outputs 421 and 429 is selected by MUX 430 to couple to input 434 (also VCO_output 435). Latch 442 and MUX 430 operates as described in FIG. 3 in response to Select signal 443 and inputs 421 and 429. MUX 430 is used to select where the VCO 400 basic frequency is set by the series connection of five or seven inverting stages. Depending on whether five or seven inverting stages are selected, the feedforward paths may need to change. For example, when all seven inverting stages are used, the output of FFE 416 is coupled to the output of inverter 422 by electronic switch (SW) 460 and the output of FFE 420 is coupled to the output of inverter 426 with SW 461. However, when only five inverting stages are used for VCO 400, then inverters 422 and 426 are switched out of the loop by SWs 460 and 461, respectively, setting the frequency of VCO 400. In this case, the output of FFE 416 must be routed to the output 405 of inverter 402. MUX 436 receives the output of FFE 416 and FFE 424 and selects which feedback path is used depending on whether five or seven inverting stages are used to set the VCO frequency. Likewise, MUX 437 selects whether the output of FFE 420 or FFE 428 is coupled to the output of inverter 406. MUXs 430, 436, and 437 all receive the same signal Ssel 431 for switching the feedforward paths to assure the switching of all paths are synchronous. VCO 400 has two frequency ranges which may be selected dynamically glitch free in response to logic states of Select 443. Each range may be further varied using a control voltage to each of the FFEs 404, 408, 412, 416, 420, 424 and 428. The control voltage is not shown is this diagram but is illustrated in FIG. 1 and FIG. 2.

Figure 5:
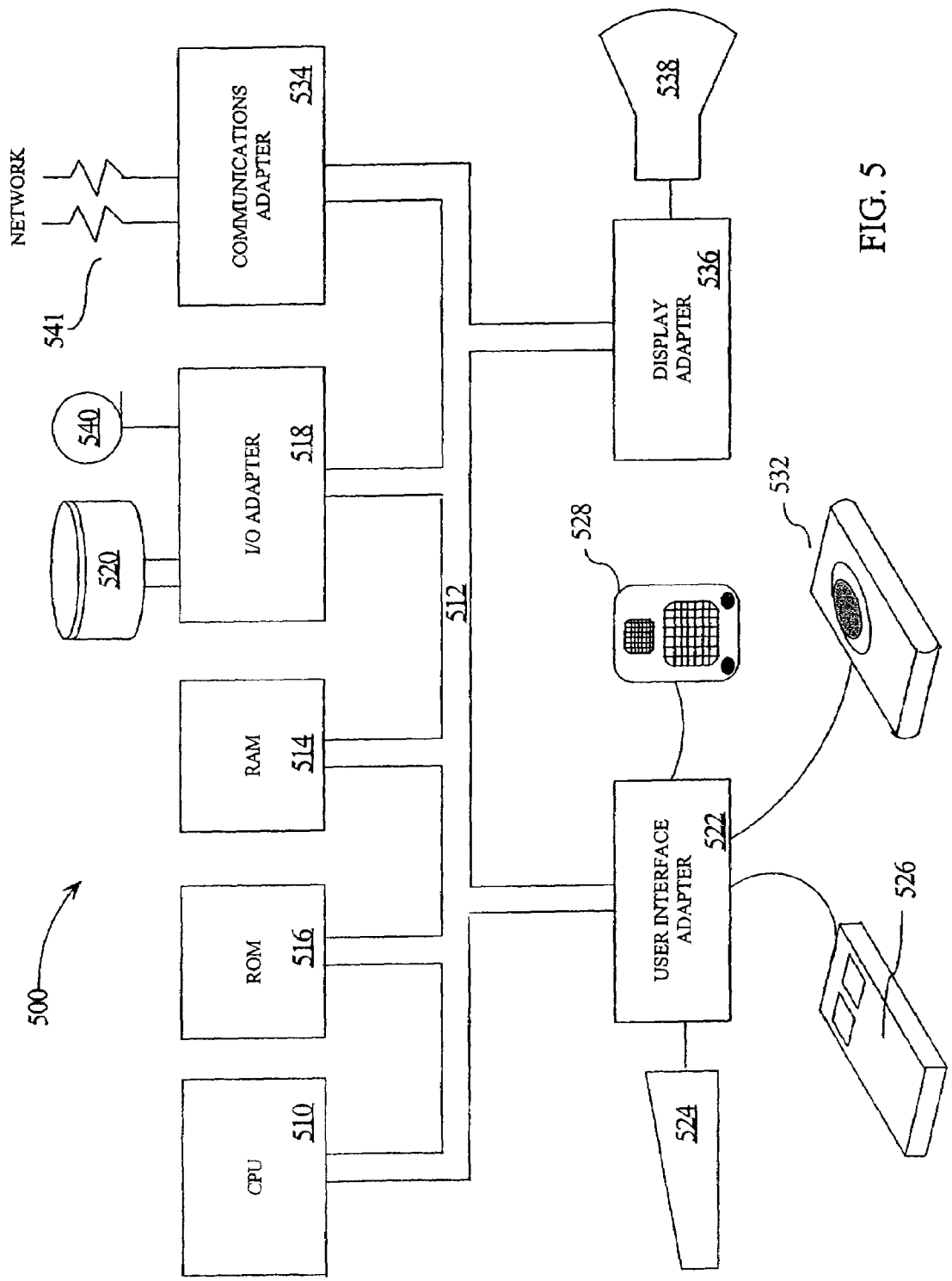
FIG. 5 is a block diagram of a data processing system suitable to use embodiments of the present invention for clock generation.

FIG. 5 is a high level functional block diagram of a representative data processing system 500 suitable for practicing the principles of the present invention. Data processing system 500, includes a central processing system (CPU) 510 operating in conjunction with a system bus 512. System bus 512 operates in accordance with a standard bus protocol, such as the ISA protocol, compatible with CPU 510. CPU 510 operates in conjunction with electronically erasable programmable read-only memory (EEPROM) 516 and random access memory (RAM) 514. Among other things, EEPROM 516 supports storage of the Basic Input Output System (BIOS) data and recovery code. RAM 514 includes, DRAM (Dynamic Random Access Memory) system memory and SRAM (Static Random Access Memory) external cache. I/O Adapter 518 allows for an interconnection between the devices on system bus 512 and external peripherals, such as mass storage devices (e.g., a hard drive, floppy drive or CD/ROM drive), or a printer 540. A peripheral device 520 is, for example, coupled to a peripheral control interface (PCI) bus, and I/O adapter 518 therefore may be a PCI bus bridge. User interface adapter 522 couples various user input devices, such as a keyboard 524, mouse 526, touch pad 532 or speaker 528 to the processing devices on bus 512. Display 538 which may be, for example, a cathode ray tube (CRT), liquid crystal display (LCD) or similar conventional display units. Display adapter 536 may include, among other things, a conventional display controller and frame buffer memory. Data processing system 500 may be selectively coupled to a computer or telecommunications network 541 through communications adapter 534. Communications adapter 534 may include, for example, a modem for connection to a telecom network and/or hardware and software for connecting to a computer network such as a local area network (LAN) or a wide area network (WAN). CPU 510 and other components of data processing system 500 may contain a PLL loop for generating clocks which operate with a wide range interleaved VCO according to embodiments of the present invention.

Figure 6:
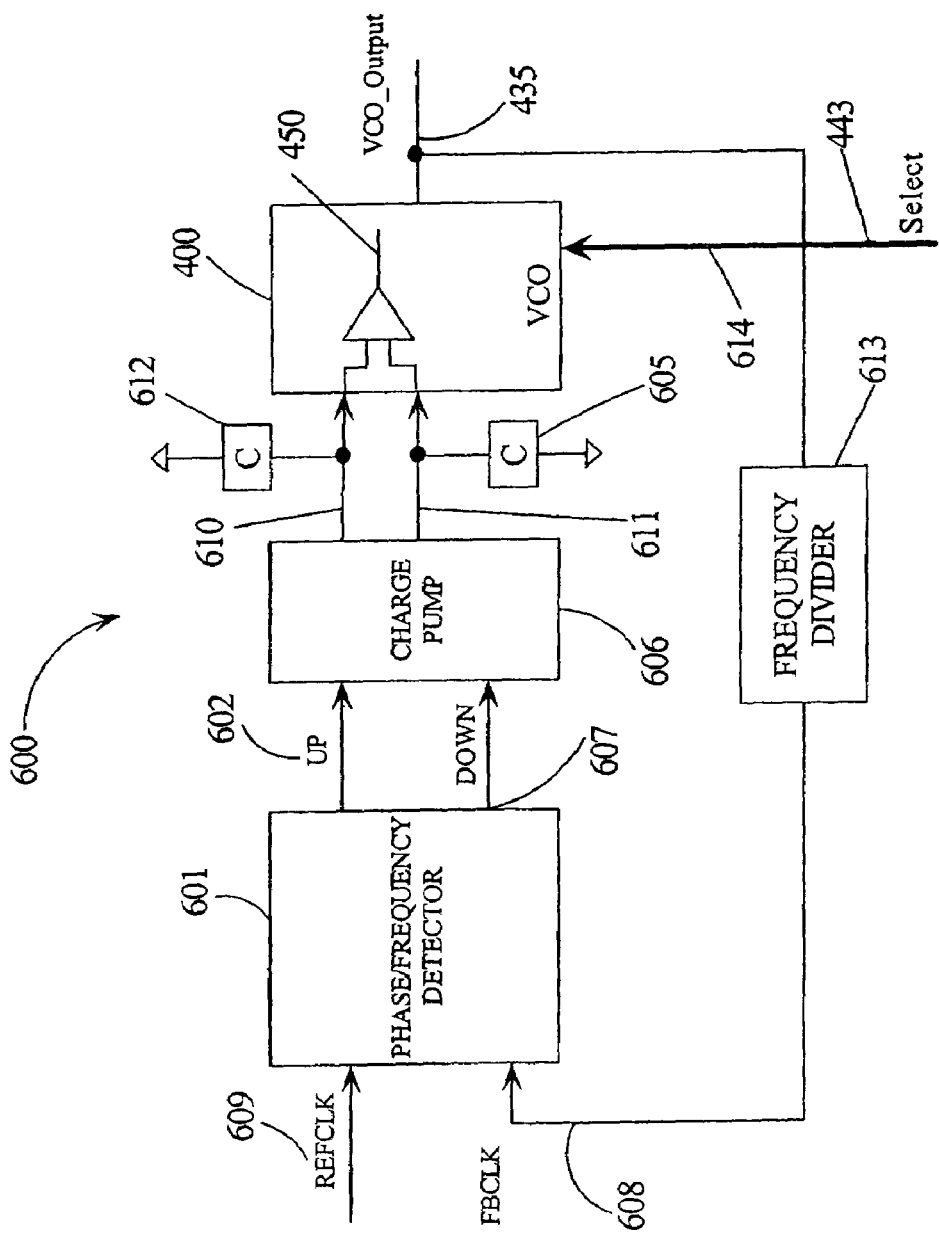
FIG. 6 is a block diagram of a phase lock loop suitable to use embodiments of the present invention.

FIG. 6 is a block diagram of a representative phase lock loop circuit 600 suitable for practicing the principles of the present invention. Reference clock (RCLK) 609 and feedback clock (FBCLK) 608 are compared in phase/frequency detector (PFD) 601 generating UP signal 602 and DOWN signal 607 which are applied as control signals to charge pump 606. UP signal 602 and DOWN signal 607 are used to control current sources in charge pump 606. Charge pump 606 has charge pump nodes 610 and 611. Capacitor 612 is coupled between charge pump node 610 and ground and capacitor 605 is coupled between charge pump node 611 and ground. UP signal 602 and DOWN 607 are generated in response to a lead or lag phase difference between RCLK 609 and FBCLK 608. Since RCLK 609 and FBCLK 608 cannot concurrently have a lead and a lag phase error, UP signal 602 and DOWN 607 are mutually exclusive signals. VCO output 435 is frequency divided by frequency divider 613 generating FBCLK 608. VCO 400 may have multiple frequency ranges controlled by select signals Select 443 according to embodiments of the present invention. The differential signal between charge pump nodes 610 and 611 may be used directly or converted to a single ended control voltage 450 to control the frequency of VCO 400 within each of the frequency ranges. VCO may be replaced with a more general VCO 900 illustrated in FIG. 9 with corresponding frequency select signals 916.

Figure 9:
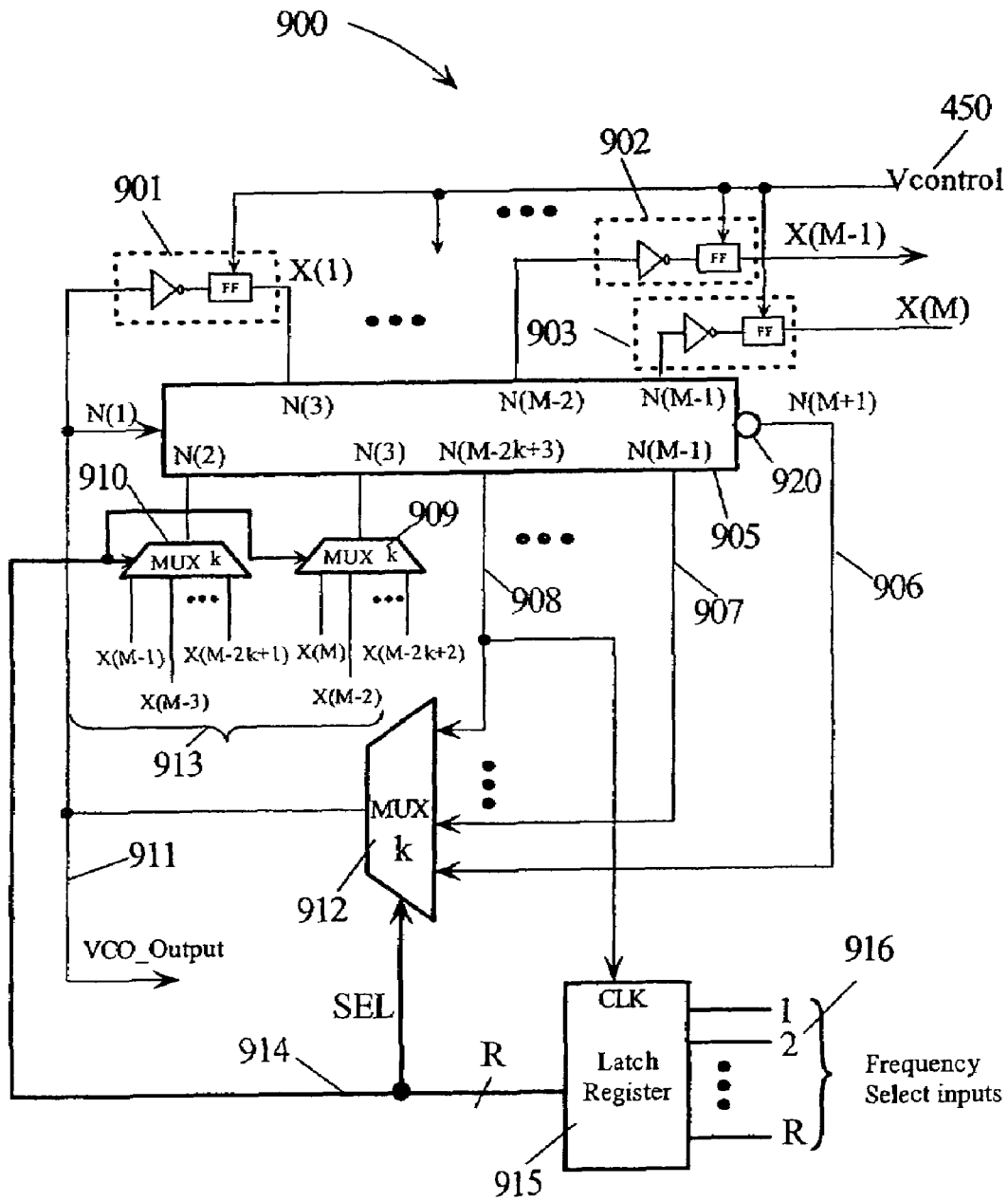
FIG. 9 is a generalized block diagram of embodiments of the present invention.

VCO 400 is shown with only two frequency ranges. FIG. 9 is a block diagram of an VCO 900 with k ranges. The k ranges are selected using SEL 914 where the number of bits in SEL 914 corresponds to the k ranges. For example, for two ranges, the SEL 914 may be a single bit for four ranges then SEL 914 must be two or more bits. Latch register 915 comprises multiple latches like latch 301 in FIG. 3 each bit of SEL 914. Frequency select inputs 916 generating SEL 914 may be asynchronous with VCO output signal 911.

Block 905 comprises a string of M inverting stages (not shown), wherein the first inverting stage has an input coupled to node N(1) and the last inverting stage has an output coupled to node N(M+1). Circle 920 denotes that overall Block 905 has an inverting function from node N(1) to the output of the Mth inverting stage, N(M+1). In one embodiment, the inverting stages are grouped into M groups of three inverting stages. While other embodiments may use M groups with a different odd number of inverting stages (e.g., five) depending on the magnitude of M. For simplicity, three will be used in the explanation of FIG. 9.

Each of the groups (three inverting stages) is paralleled with a feedforward element (FFE) (e.g., 901 and 902) that receives control voltage 950 to provide voltage variability. The description of FIG. 1 describes voltage control using an FFE (e.g., FEE 901). FFE 901 is coupled from node N(1) to the node N(3) which is coupled to the output of the third inverting stage (not shown). Various nodes coupled to inverting stages are shown inside block 905. Any odd number of M inverter stages, where M is greater than three, may form a group by feeding from an input of a first inverting stage around three sequential inverting stages to the output of the third inverting stage. Another group may be formed by feeding from the input of the second inverting stage around another three sequential inverting stages to the output of the fourth inverting stage. This may be continued until stage M−1 and M. To include these two stages in a group requires the FFE element to couple back to outputs of the first and second inverting stages. As long as there is only one output that is coupled back to the input, then these groupings may be hard wired. However, when multiple frequency ranges are desired, it is seen that a circuit (e.g., a multiplexer (MUX)) must be used to select between two or more possible outputs to feed back to the input. This determines the number of inverting stages in the ring oscillator and thus the basic frequency ranges of the VCO 900. VCO 900 has been generalized to provide for a wide range interleaved VCO with k frequency ranges. The assumption in FIG. 9 is that a ring oscillator with M inverting stages utilizes the Mth inverting stage in some selected frequency range. The reasoning is that fewer stages could be used if the Mth inverting stage was not being used as an output. For this reason, the feedback outputs for k frequency ranges are from candidate nodes N(M+1), N(M−1), . . . N(M−2k+3). It is understood that N(M−2k+3) must correspond to an actual node for a given M and k.

When an FFE within block 905 has more than one possible path to a forward stage, then electronic switches (e.g., like SW 460 and 461 in FIG. 4) are used to isolate the uncoupled paths. This prevents a feedback signal from being coupled to more than one feedforward circuit. These switches are not shown in FIG. 9 to simplify circuitry.

Since groups of three inverting stages may be made using all but the last two inverting stages in a sequence with only forward coupling, then only the last two inverting stages need to be coupled back to a preceding inverting stage. Frequency ranges are configured by reducing the number of inverting stages in the sequence for a given ring oscillator. Inverting stages must be reduced by orders of two, thus for k frequency ranges, the candidate outputs are from nodes N(M+1), N(M−1), . . . N(M−2k+3). To select more than two frequency ranges as described relative to FIG. 4 requires a MUX 912 and MUXes 909 and 910 with as many inputs as there are ranges. Thus for k frequency ranges, MUXes, 909, 910 and 912 have k inputs and one output. The output of MUX 910 is coupled to node N(2) and the output of MUX 909 is coupled to node N(3). MUX 910 receives outputs from the FFEs (e.g., 901, . . . 902, and 904) as indicated. X(1) is the output of first FFE 901, X(M−1) is the output of the next to last FFE 902 and X(M) is the output of the last FFE 904. Since all connections internal to 905 are not shown, this is a convenient way to consistently illustrate the signal's connections. For a VCO 900 with k frequency ranges, MUX 910 receives outputs X(M−1), X(M−3), . . . . X(M−2k+2) and MUX 909 receives outputs X(M), X(M−2), . . . X(M−2k+2) With a latch register 915 made up of Latches 301 (refer to description of FIG. 3), clocked by any one of the possible k outputs (906, 907, . . . 908) and operating as described relative to FIG. 3, a k frequency range wide band interleaved VCO 900 may be configured to dynamically switch between the k frequency ranges glitch free.

Figure 7:
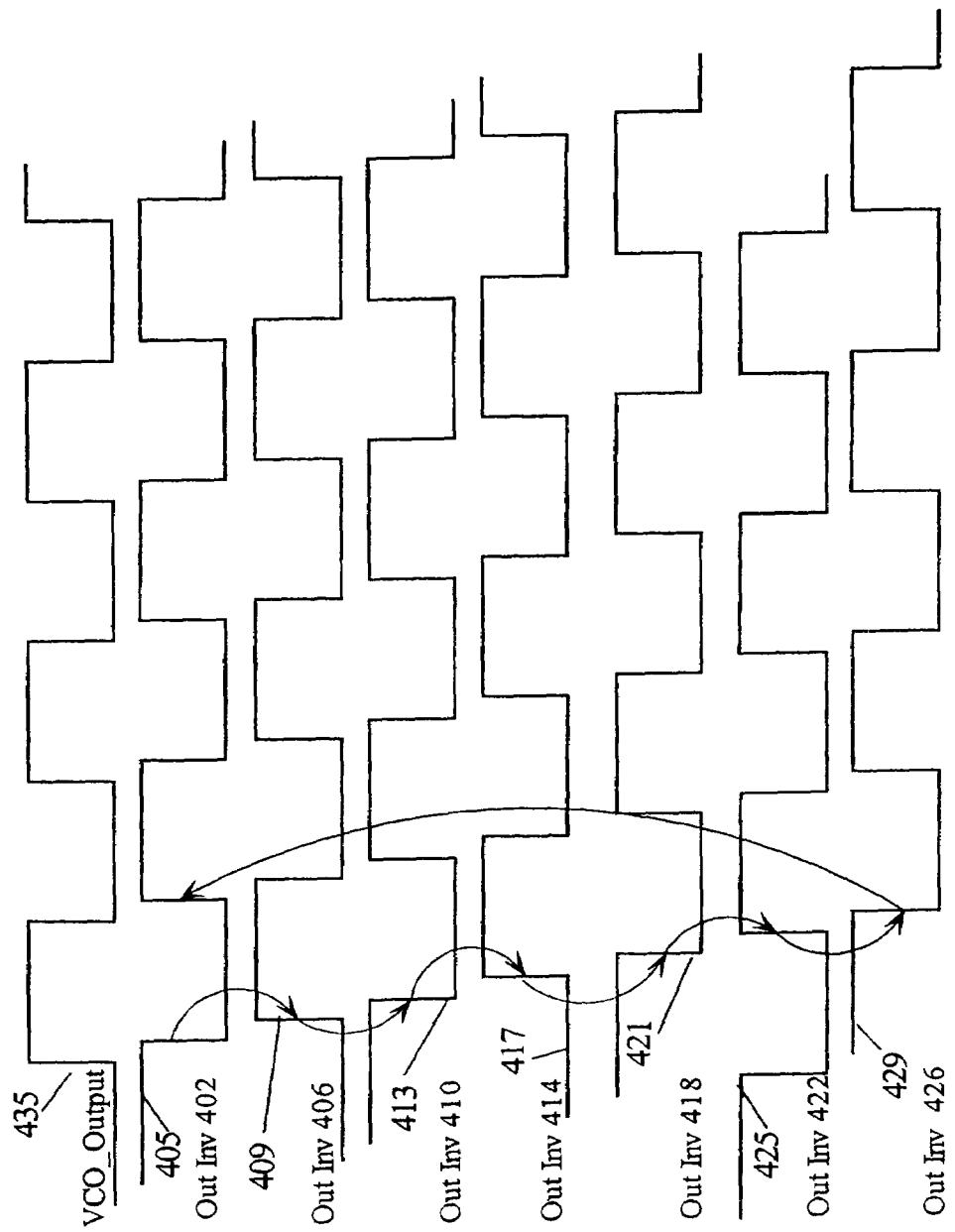
FIG. 7 is timing diagram of selected signals from the circuit of FIG. 4.

FIG. 7 is a timing diagram of the outputs of the inverting stages relative to FIG. 4 wherein VCO 400 is configured with all seven inverting stages in the ring oscillator circuit. The arrows indicate the sequence of transitions within the sequence of inverting stages 402, 406, 410, 414, 418, 422, and 425. Since VCO_Output 435 is coupled to the output 429 of inverting stage 426, these signals are essentially in phase.

Figure 8:
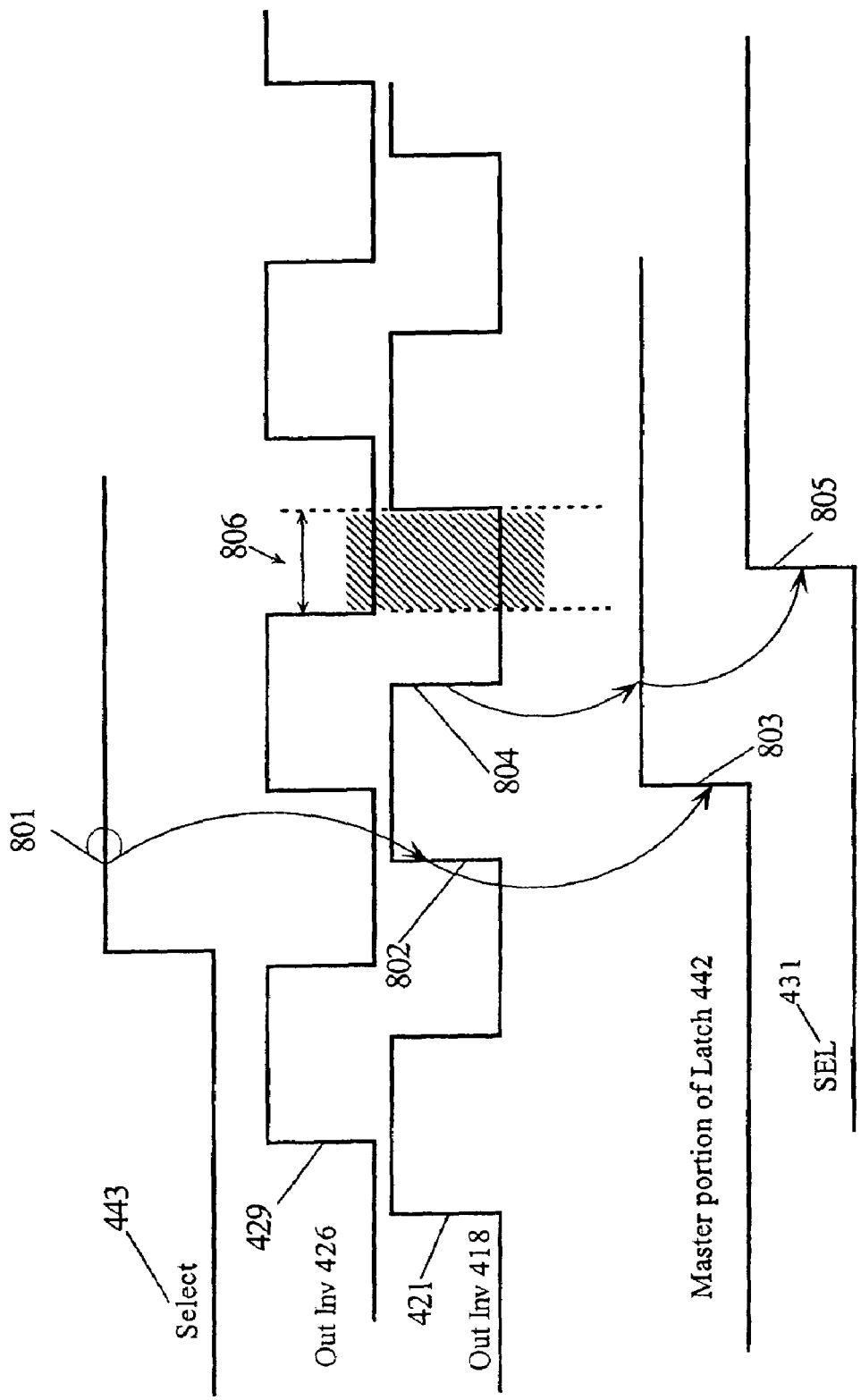
FIG. 8 is a timing diagram of selected signals for the circuit of FIG. 4.

FIG. 8 is another timing diagram of signals during a frequency range transition. When Select 443 has a logic one state 801 and output 421 transitions (802) to a logic one, then the state 801 of Select 443 is loaded into the master portion of Latch 442. Transition 803 is internal to Latch 442. When output 421 transitions to a logic zero (804), the values of Select 443 loaded previously is asserted on SEL 431 (805). Transition 805 occurs in the window 806 when possible outputs 429 and 421 are both at a logic zero assuring glitch free frequency range change.

Although the present invention and its advantages have been described in detail, it should be understood that various changes, substitutions and alterations can be made herein without departing from the spirit and scope of the invention as defined by the appended claims.

What is claimed is:

1. A voltage controlled oscillator (VCO) having a VCO output signal with selectable frequency ranges comprising:

M inverting circuits coupled in series forming M+1 nodes N(1) to N(M+1), wherein M is an odd integer number greater than three;

M voltage controlled feedforward inverting (VCFF) circuits, each VCFF(J) having a control voltage input, a signal input I(J) coupled to a corresponding node N(J), where J is a number (1 to M), and a signal output X(J), the first number (M−2K) of the signal outputs X(1) to X(M−2K) are coupled to corresponding nodes N(4) to N(M−2K+3);

first circuitry for selectively coupling a first feedback signal selected from signals on K of first candidate nodes (N(M+1) to N(M−2K+3)), to node N(1), wherein K is an integer number greater than or equal to two and less than or equal to (M−5), in response to the one or more latched select signals, thereby generating the VCO output signal;

second circuitry for selectively coupling a second feedback signal from signals on K second candidate outputs X(M−1) to X(M−2K+1) to node N(2) in response to the one or more latched select signals; and third circuitry for selectively coupling a third feedback signal from signals on K third candidate outputs X(M) to X(M−2K+2) to node N(3) in response to the one or more latched select signals.

2. The VCO of claim 1, wherein the one or more latched select signals are generated by latching asynchronous select signals when the first feedback signal coupled to node N(1) from a presently selected node N(Pr) from nodes N(M+1) to N(M−2K+3) setting of a present frequency range of the VCO has the same logic state as a signal on a next selected node N(Pn) setting a next frequency range, thereby assuring switching from the present frequency range to the next frequency range of the VCO occurs glitch free.

3. The VCO of claim 1, wherein the number of candidate outputs K is limited by the requirement that all of the K first candidate outputs have the same logic state for a time period necessary to generate a new latched select signal and to switch between a present and a next candidate output.

4. The VCO of claim 1, wherein the VCO output signal is generated at node N(1) or node N(M+1).

5. The VCO of claim 1, wherein the one or more latched select signals are generated by latching asynchronous select signals on a state of a signal selected from signals on one of the K first candidate nodes N(M+1) to N(M−2K+3).

6. A phase locked loop circuit for generating an output clock signal with a selectable frequency range and a frequency that is a multiple number N times the frequency of a reference clock signal comprising:

a voltage controlled oscillator (VCO) generating the output clock signal with a frequency range set by one or more frequency range select signals, a frequency divider for frequency dividing the output clock signal by N generating a frequency divided clock signal, a phase frequency detector for comparing the frequency divided clock signal to the reference clock signal and generating a phase/frequency error signal, circuitry for converting the phase/frequency error signal to the control voltage, the VCO having M of inverting circuits (IVC) coupled in series forming M+1 nodes N(1) to N(M+1), wherein M is an odd integer number including greater than three, the VCO having:

M voltage controlled feedforward inverting (VCFF) circuits, each VCFF(J) having a control voltage input, a signal input I(J) coupled to a corresponding node N(J), where J is a number (1 to M), and a signal output X(J), the first number (M−2K) of the signal outputs X(1) to X(M−2K) are coupled to corresponding nodes N(4) to N(M−2K+3);

first circuitry for selectively coupling a first feedback signal selected from signals on K of first candidate nodes (N(M+1) to N(M−2K+3)), to node N(1), wherein K is an integer number greater than or equal to two and less than or equal to (M−5), in response to the one or more latched select signals, thereby generating the VCO output signal;

second circuitry for selectively coupling a second feedback signal from signals on K second candidate outputs X(M−1) to X(M−2K+1) to node N(2) in response to the one or more latched select signals; and third circuitry for selectively coupling a third feedback signal from signals on K third candidate outputs X(M) to X(M−2K+2) to node N(3) in response to the one or more latched select signals.

7. The phase locked loop circuit of claim 6, wherein the one or more latched select signals are generated by latching asynchronous select signals when the first feedback signal coupled to node N(1) from a presently selected node N(Pr) from nodes N(M+1) to N(M−2K+3) setting of a present frequency range of the VCO has the same logic state as a signal on a next selected node N(Pn) setting a next frequency range, thereby assuring switching from the present frequency range to the next frequency range of the VCO occurs glitch free.

8. The phase locked loop circuit of claim 6, wherein the number of candidate outputs K is limited by the requirement that all of the K first candidate outputs have the same logic state for a time period necessary to generate a new latched select signal and to switch between a present and a next candidate output.

9. The phase locked loop circuit of claim 6, wherein the output clock signal is generated at node N(1) or node N(M+1).

10. The phase locked loop circuit of claim 6, wherein the one or more latched select signals are generated by latching asynchronous select signals on a state of a signal selected from signals on one of the K first candidate nodes N(M+1) to N(M−2K+3).

11. A data processing system comprising:
a central processing unit (CPU) clocked by a CPU clock signal;
a random access memory (RAM);
a read only memory (ROM);
an I/O adapter;
a bus system coupling said CPU to said ROM, said communications adapter, said I/O adapter, and said RAM, wherein the CPU clock signal is generated by phase locked loop circuitry with a frequency a multiple number N times the frequency of a reference clock signal comprising:

a voltage controlled oscillator (VCO) generating the output clock signal with a frequency range set by one or more frequency range select signals, a frequency divider for frequency dividing the output clock signal by N generating a frequency divided clock signal, a phase frequency detector for comparing the frequency divided clock signal to the reference clock signal and generating a phase/frequency error signal, circuitry for converting the phase/frequency error signal to the control voltage, the VCO having M of inverting circuits (IVC) coupled in series forming M+1 nodes N(1) to N(M+1), wherein M is an odd integer number including greater than three, the VCO having;

M voltage controlled feedforward inverting (VCFF) circuits, each VCFF(J) having a control voltage input, a signal input I(J) coupled to a corresponding node N(J), where J is a number (1 to M), and a signal output X(J), the first number (M−2K) of the signal outputs X(1) to X(M−2K) are coupled to corresponding nodes N(4) to N(M−2K+3);

first circuitry for selectively coupling a first feedback signal selected from signals on K of first candidate nodes (N(M+1) to N(M−2K+3)), to node N(1), wherein K is an integer number greater than or equal to two and less than or equal to (M−5), in response to the one or more latched select signals, thereby generating the VCO output signal;

second circuitry for selectively coupling a second feedback signal from signals on K second candidate outputs X(M−1) to X(M−2K+1) to node N(2) in response to the one or more latched select signals; and third circuitry for selectively coupling a third feedback signal from signals on K third candidate outputs X(M) to X(M−2K+2) to node N(3) in response to the one or more latched select signals.

12. The data processing system of claim 11, wherein the one or more latched select signals are generated by latching asynchronous select signals when the first feedback signal coupled to node N(1) from a presently selected node N(Pr) from nodes N(M+1) to N(M−2K+3) setting of a present frequency range of the VCO has the same logic state as a signal on a next selected node N(Pn) setting a next frequency range, thereby assuring switching from the present frequency range to the next frequency range of the VCO occurs glitch free.

13. The data processing system of claim 11, wherein the number of candidate outputs K is limited by the requirement that all of the K first candidate outputs have the same logic state for a time period necessary to generate a new latched select signal and to switch between a present and a next candidate output.

14. The data processing system of claim 11, wherein the output clock signal is generated at node N(1) or node N(M+1).

15. The data processing system of claim 11, wherein the one or more latched select signals are generated by latching asynchronous select signals on a state of a signal selected from signals on one of the K first candidate nodes N(M+1) to N(M−2K+3).

* * * * *